(12) United States Patent
Savas et al.

(10) Patent No.: US 6,169,271 B1
(45) Date of Patent: Jan. 2, 2001

(54) MODEL BASED METHOD FOR WAFER TEMPERATURE CONTROL IN A THERMAL PROCESSING SYSTEM FOR SEMICONDUCTOR MANUFACTURING

(75) Inventors: Stephen E. Savas, Alameda; Martin L. Hammond, Cupertino, both of CA (US); Robert Müeller, Reichertshausen (DE); Jean-François Daviet, Cran-Gervrier (FR)

(73) Assignee: Mattson Technology, Inc., Fremont, CA (US)

( * ) Notice: Under 35 U.S.C. 154(b), the term of this patent shall be extended for 0 days.

(21) Appl. No.: 09/351,987

(22) Filed: Jul. 12, 1999

Related U.S. Application Data

(60) Provisional application No. 60/092,563, filed on Jul. 13, 1998.

(51) Int. Cl.[7] .................................................. F27B 5/14
(52) U.S. Cl. .......................... 219/390; 219/411; 219/494; 374/129
(58) Field of Search .................................. 219/390, 411, 219/413, 494; 374/129, 134, 181

(56) References Cited

U.S. PATENT DOCUMENTS

| | | | |
|---|---|---|---|
| 4,555,273 | 11/1985 | Collins et al. | 148/1.5 |
| 4,794,217 | 12/1988 | Quan et al. | 437/247 |
| 4,821,674 | 4/1989 | deBoer et al. | 118/666 |
| 4,891,499 | 1/1990 | Moslehi | 219/502 |
| 4,909,314 | 3/1990 | Lamont, Jr. | 165/80.3 |
| 4,956,538 | 9/1990 | Moslehi | 219/121.6 |
| 4,993,355 | 2/1991 | deBoer et al. | 118/641 |
| 4,996,942 | 3/1991 | deBoer et al. | 118/666 |
| 5,001,327 | 3/1991 | Hirasawa et al. | 219/390 |
| 5,002,630 | 3/1991 | Kermani et al. | 156/610 |
| 5,102,231 | 4/1992 | Loewenstein et al. | 374/129 |
| 5,114,242 | 5/1992 | Gat et al. | 374/128 |
| 5,154,512 | 10/1992 | Schietinger et al. | 374/9 |
| 5,156,461 | 10/1992 | Moslehi et al. | 374/121 |
| 5,180,226 | 1/1993 | Moslehi | 374/127 |
| 5,198,034 | 3/1993 | deBoer et al. | 118/725 |
| 5,208,643 | 5/1993 | Fair | 356/43 |
| 5,326,170 | 7/1994 | Moslehi et al. | 374/2 |
| 5,427,620 | 6/1995 | deBoer et al. | 118/725 |
| 5,430,271 | 7/1995 | Orgami et al. | 219/388 |
| 5,444,217 | 8/1995 | Moore et al. | 219/405 |
| 5,549,756 | 8/1996 | Sorensen et al. | 118/715 |
| 5,660,472 | 8/1997 | Peuse et al. | 374/128 |
| 5,676,205 | 10/1997 | White | 165/275 |
| 5,755,511 | 5/1998 | Peuse et al. | 374/128 |
| 5,809,211 | * 12/1999 | Anderson et al. | 392/416 |
| 5,830,277 | 11/1998 | Johnsgard et al. | 118/725 |
| 5,998,767 | * 12/1999 | Kersch et al. | 219/390 |
| 6,043,460 | 3/2000 | Johnsgard et al. | 219/390 |

FOREIGN PATENT DOCUMENTS

| | | | |
|---|---|---|---|
| 0 612 862 A1 | 8/1994 | (EP) | C23C/16/52 |
| 0 718 610 A1 | 6/1996 | (EP) | G01J/5/00 |
| 1-124726 | 5/1989 | (JP) | G01J/5/10 |
| 2-238616 | 9/1990 | (JP) | H01L/21/027 |
| 4-61117 | 2/1992 | (JP) | H01L/21/205 |

OTHER PUBLICATIONS

M. Moslehi et al., "Advanced Equipment and Sensor Technologies for Rapid Thermal Processing," ULSI Sci. & Tech. (J.M. Andrews & G.K. Celler, eds.), at 503–527. Electrochemical Society, Pennington NJ 1991.

L. Peters, "The Hottest Topic in RTP," Semiconductor International, at 56–62, Aug. 1991.

F. Roozeboom, "Manufacturing Equipment Issues in Rapid Thermal Processing," Rapid Thermal Proc. Sci. & Tech. (R. Fair ed.) at 349–423 (1993).

R. Sheets, "Temperature Measurement and Control in a Rapid Thermal Processor," Mat. Res. Soc. Symp. Proc. vol. 52, 1986 Materials Research Society at 191–197.

* cited by examiner

*Primary Examiner*—Teresa Walberg
*Assistant Examiner*—Shawntina T. Fuqua
(74) *Attorney, Agent, or Firm*—Wilson Sonsini Goodrich & Rosati

(57) ABSTRACT

A method for controlling wafer temperature in a thermal reactor. A wafer is positioned between two or more surfaces, one or more of which are heated. A control temperature is calculated based on the temperatures of the surfaces. The heat applied to the surface(s) is adjusted in response to the control temperature in order to maintain the wafer temperature within narrowly defined limits.

22 Claims, No Drawings

MODEL BASED METHOD FOR WAFER TEMPERATURE CONTROL IN A THERMAL PROCESSING SYSTEM FOR SEMICONDUCTOR MANUFACTURING

REFERENCE TO RELATED APPLICATION

The present application claims priority from U.S. provisional application Ser. No. 60/092,563 filed Jul. 13, 1998. U.S. provisional application Ser. No. 60/092,563 is hereby incorporated herein by reference in its entirety.

FIELD OF THE INVENTION

Typical thermal process (TP) systems involve placing semiconductor wafers in a hot-walled environment to heat them and maintain their equilibrium temperature at or above about 400° C., so as to produce annealing or other thermally induced processes. In such thermal processing it may be important to precisely control the temperature at which the wafer is processed so that the resulting material properties are within as narrow a range about the desired values as possible. This is especially true in the latest semiconductor manufacturing processes where ion implantation anneals must achieve very precisely controlled diffusion depth for dopants, or for metallization annealing in which precise metal-silicide phase formation is critical to material processes.

However, in such systems precise measurement of the wafer or work piece temperature can be very difficult. This is due to the fact that the wafer temperature is rarely equal to the temperature of any of the surfaces which are in radiant or conductive thermal contact with it. Additionally, direct measurement of the wafer temperature is not easy because contact with the wafer by a temperature probe such as a thermocouple is very likely to contaminate the wafer and the use of optical pyrometry usually requires a precise knowledge of the emissivity of the wafer, which can vary with changes in temperature as well as the properties of any coatings or layers which may have been deposited on the surface. There are methods in which a highly reflective surface is used to avoid emissivity dependence or in which the emissivity of the wafer surface is measured, but these are difficult or expensive to implement in a processing system for volume production.

For example, one method for pyrometer-based temperature measurement which is insensitive to the emissivity of the wafer uses a highly reflective mirror surface adjacent to the wafer to function. This has practical difficulties because such a mirror needs to be non-contaminating of the wafer with metals and other impurity elements. This can be difficult to guarantee while using the usual reflective materials such as metals. Multi-layer refractive materials may also be used as mirrors but may not work well across the range of wavelengths covering the peak in the Planck radiation distribution and therefore may not be very efficient mirrors for thermal radiation, and may be subject to substantial heat absorption. They may also become clouded by condensates or reactions with process gases or degraded by high temperature.

DESCRIPTION

The wafer temperature control system of an embodiment of the invention comprises regulating the heat applied to one of two or more heated surfaces which enclose the wafer to maintain a preset value for a calculated control parameter, $T_{CONTROL}$. The control parameter is calculated from the measured temperatures of both surfaces which enclose the wafer such that the wafer temperature remains within narrowly defined limits about a desired value. This embodiment can be used in systems where one or both of the two surfaces can be directly heated and where these components are at different temperatures.

Examples of suitable thermal processing systems which can be used in accordance with the present invention are described in co-pending U.S. patent application Ser. No. 08/499,986 filed Jul. 10, 1995, for System and Method for Thermal Processing of a Semiconductor Substrate; Ser. No. 08/876,788 filed Jun. 16, 1997, for System and Method for Thermal Processing of a Semiconductor Substrate; and Ser. No. 08/923,661 filed Sep. 4, 1997, for System and Method for Rapid Thermal Processing, all of which are hereby fully incorporated by reference. Any of the heated surfaces of these reactors which enclose the wafer can be used to implement the present invention.

This method may also be extended to apply to RTP systems with more than two independent surfaces enclosing the wafer. We will show below an algorithm for calculation of such a $T_{CONTROL}$ from the measured temperatures of the surfaces of the system that is simple to calculate, accurate within a sufficient temperature range and entails minimal cost.

A system according to an exemplary embodiment may comprise a thermal reactor as described in the above referenced applications with thermocouples, optical pyrometers or other temperature sensing devices for determining the measured temperatures of the applicable surfaces. The temperature measuring devices may be operatively coupled to a control system comprising a programmable computer (which may be any of a variety of general purpose programmable computers or application specific hardware). A computer program executed by such computer is used to calculate $T_{CONTROL}$ as described below and determine appropriate adjustments that should be made to the heat provided to one of the surfaces (e.g. a resistive silicon carbide coated graphite heater). The control system may also be operatively coupled to a power supply or other controller for the heater and may adjust the heat in response to the calculated values to achieve the desired wafer temperature.

This method is applicable to a wide range of heating chamber configurations since $T_{CONTROL}$ is in a stable approximately linear correspondence with the wafer temperature and, independent within limits of variations of the temperatures of the two surfaces. In general, when the temperature of either surface surrounding the wafer is changed the wafer temperature changes. However, if the temperature of both surfaces changes so that the total heat flux to the wafer is unchanged—one surface is made warmer increasing the heat transport to the wafer while the other cools decreasing it—the wafer temperature will not change. Therefore, in one embodiment the function $T_{CONTROL}$ is chosen to depend on the temperatures of the surfaces around the wafer such that keeping it constant keeps the wafer temperature very nearly constant. The precise mathematical relationship of $T_{CONTROL}$ to the wafer temperature over the full temperature range is complex and may depend on the wafer temperature, gas pressure, wafer location and the emissivities of the wafer and the other components of the thermal process system. This is due to the fact that the wafer is in thermal equilibrium (mostly conductive and radiative) with the surfaces which enclose it. In general, however, as long as the wafer is fixed in position in the chamber with gas pressure and composition constant—causing the relative strengths of the couplings to the two surfaces to be fixed $T_{CONTROL}$ will be a smooth monotone increasing function of the wafer temperature.

Embodiments of the present invention can be used during the processing of one wafer or more than one wafer sequentially, for any process step of such wafer(s) which is meant to be at a fixed and controlled wafer temperature. Each wafer may be processed through several separate steps, each at a different temperature, and after each wafer is finished another wafer is done identically. Typically, the wafer temperature will not differ greatly from one process step to the next, but using embodiments of the present invention the temperature of one or more of the surfaces surrounding the wafer may be changed such that the newly calculated value of the control parameter (calculated from the temperatures of the two surfaces) is such as to correspond to the desired wafer temperature. Further, in a system where one of the surfaces surrounding the wafer is not actively heated, and therefore its temperature is not directly controllable, one can compensate for its temperature variations by making a compensating change in the temperature of the actively heated element, maintain $T_{CONTROL}$ at or near a predetermined value and maintaining at the desired temperature of the wafer.

$T_{CONTROL}$ is equal to the wafer temperature times a multiplicative constant, p, which is very close to 1.0, plus a constant offset, q, for any wafer temperature within some limited range of temperatures. The values of p and q may be complex functions of the wafer temperature which may be considered constants as an approximation valid for a range of wafer temperatures. Thus, by definition within this temperature range:

$$T_{CONTROL} = p(T_{WAFER}) + q \quad (1)$$

In some embodiments it was found experimentally that p will be somewhat close to unity while q will usually be small compared to $T_{WAFER}$. In one embodiment $T_{CONTROL}$ is of the same approximate magnitude as the wafer temperature, and if it is kept constant the wafer temperature will also be very nearly constant. This is true because the values of p and q can be considered constant over a small range of temperature. (In the exceptional case where p is far from 1.0, $T_{WAFER}$ may be kept nearly constant when the control parameter is held fixed as long as the constant p is not extremely large or zero.) Neither p nor q need to be determined explicitly. Equation (1) is given to illustrate the correspondence between the control parameter and the wafer temperature, and to demonstrate that when such a relationship exists holding the control parameter fixed results in holding the wafer temperature within a small range.

In one embodiment the control parameter, $T_{CONTROL}$, is calculated as a function of the measured temperatures of one or more of the components of the system which are in radiative and/or conductive thermal communication with the wafer:

$$T_{CONTROL} = a(T1) + b(T2) + \ldots + g(Tn) \quad (2)$$

In this equation a, b, . . . , g are a set of numerical constants which relate the variations in the temperatures of the components, Ti, to their effect on the wafer temperature. These constants are found by taking the ratio of the change in the wafer temperature to the change in the temperature of the i'th component of the system, Ti, due to a small temperature change in the i'th component with the other component temperatures held fixed.

$$a = \delta T_{WAFER}/\delta T1; \; b = \delta T_{WAFER}/\delta T2; \ldots; g = \delta T_{WAFER}/\delta Tn \quad (3)$$

The values of these constants will in many cases all be different, depending on the particular geometry, the process being done, the wafer type, including coatings, or the temperature range. It is very often the case that if the set of components used in (2) is complete, meaning that they span the full solid angle $4\pi$ visible to the wafer, that the sum of the coefficients, a+b+ . . . +g, is of order unity.

The approximation of equation (2) may be considered sufficiently accurate since the temperature of the wafer will change in a smoothly varying way as the temperature of any one of the components is varied while those of the other components are held fixed. The changes in the wafer temperature due to changes in the various components may be added together to produce the total change in the wafer temperature. This is equivalent to the wafer temperature change being linear in the temperature changes of the components over small ranges of wafer and component temperatures.

In order to be sufficiently precise this method requires that for a given process control parameter (and therefore set of constants: a, b, . . . , g) the wafer temperature should be within a range, of order 5% to 10% of the absolute temperature (degrees K) in order that the error not exceed about 1%. That is to say that the sequence of temperature states which are to be held for some specified process time in a multi-step process must not differ from highest to lowest by much more than this 10% of the absolute temperature while using a single control parameter function. If the total range of temperatures is greater than this in a given multi-step process more than one control parameter will need to be used. Further, it requires that the range of temperature during the sequence of process steps for any of the parts of the system in radiative or conductive contact with the wafer be small compared with the absolute temperature, of the order of 20% of the absolute temperature (degrees K).

The approximation of equation (2) and method of temperature control is not strictly valid when convective heat transfer is significant. It may still work in such case, but may become less exact with a slight change in temperature due to various factors including the onset of unstable convective heat transfer modes.

In the case of more complex wafer enclosure with more than two components, with at least one not heated, the p and q are also functions of the proportions of the total external power input to the chamber via the different actively heated components.

Thus, when there are two or more actively heated components of the system, any set of constants p and q applies only to a particular combination of narrow temperature ranges for the actively heated components. The values of p and q are unique only in case there is only one actively heated component and thus only one combination of component temperatures for a given wafer temperature.

Many modifications of the exemplary embodiments of the invention disclosed above will readily occur to those skilled in the art. Accordingly, the invention is to be construed as including all structure and methods that fall within the scope of the appended claims.

What is claimed is:

1. A thermal processing system for processing a wafer at a desired temperature, the thermal processing system comprising:

a heater supplying heat to a heated surface within the thermal processing system;

a second surface within the thermal processing system, wherein the wafer is positioned between the heated surface and the second surface for processing the wafer;

a temperature measuring system for measuring the temperature of the heated surface and the temperature of the second surface;

a control system operatively coupled to the temperature measuring system, wherein the control system is configured to calculate a control parameter $T_{control}$;

wherein the control parameter is a linear combination equal to a first constant times the temperature of the heated surface plus a second constant times the temperature of the second surface; and wherein the control system is configured to adjust the power applied to the heater in response to the control parameter.

2. The thermal processing system of claim 1, wherein the first constant is found by taking the ratio of a change in the wafer temperature to a change in the temperature of the heated surface with the temperature of the second surface held substantially constant, and wherein the second constant is found by taking the ratio of a change in the wafer temperature to a change in the temperature of the second surface with the temperature of the heated surface held substantially constant.

3. The thermal processing system of claim 1, wherein the control system is configured to determine the control parameter based a sum of partial derivatives according to the following relationship:

$$T_{control} = \left(\frac{\partial T_{wafer}}{\partial T_1}\right)_{T_2} T_1 + \left(\frac{\partial T_{wafer}}{\partial T_2}\right)_{T_1} T_2;$$

wherein $T_1$ is the temperature of the heated surface and $T_2$ is the temperature of the second surface.

4. The thermal processing system of claim 1, wherein the control parameter is maintained at a substantially constant value while processing successive wafers.

5. The thermal processing system of claim 1, wherein the control parameter is maintained within a range of values while processing successive wafers.

6. The thermal processing system of claim 1, wherein the control parameter is maintained within a range of values while processing a wafer through a sequence of process steps.

7. The thermal processing system of claim 1, wherein $T_{control}$ is a smooth monotonically increasing function of the wafer temperature.

8. The thermal processing system of claim 1, wherein the first constant and the second constant sum approximately to unity when the heated surface and the second surface present a solid angle of substantially $4\pi$ to the wafer.

9. A thermal processing system for processing a wafer at a desired temperature, the thermal processing system comprising:

a heater supplying heat to at least one heated surface within the thermal processing system;

at least one additional surface within the thermal processing system;

a temperature measuring system for measuring the temperature of the at least one heated surface and the temperature of the at least one additional surface;

a control system operatively coupled to the temperature measuring system, wherein the control system is configured to calculate a control parameter $T_{control}$;

wherein the control parameter is a linear combination equal to a first constant times the temperature of the at least one heated surface plus a second constant times the temperature of the at least one additional surface; and wherein the control system is configured to adjust the power applied to the heater in response to the control parameter.

10. The thermal processing system of claim 9, wherein the first constant is the ratio of a change in the wafer temperature to a change in the temperature of the at least one heated surface with the temperatures of the other surfaces held substantially constant, and wherein the second constant is the ratio of a change in the wafer temperature to a change in the temperature of each of the at least one heated surface with the temperatures of the other surfaces held substantially constant.

11. The thermal processing system of claim 9, wherein the control system is configured to determine the control parameter based on a sum of partial derivatives according to the following relationship:

$$T_{control} = \sum_{i=1}^{n} \left(\frac{\partial T_{wafer}}{\partial T_i}\right)_{T_{k \neq i,j}} T_i + \sum_{j=1}^{m} \left(\frac{\partial T_{wafer}}{\partial T_j}\right)_{T_{i \neq j,i}} T_j;$$

wherein $T_{i=1 \ldots n}$ is the temperature of the at least one heated surface, and $T_{j=1 \ldots m}$ is the temperature of the at least one additional surface.

12. The thermal processing system of claim 9 including at least a second additional surface.

13. The thermal processing system of claim 9, wherein the control parameter is maintained at a substantially constant value while processing successive wafers.

14. The thermal processing system of claim 9, wherein the control parameter is maintained within a range of values while processing successive wafers.

15. The thermal processing system of claim 9, wherein the control parameter is maintained within a range of values while processing a wafer through a sequence of process steps.

16. The thermal processing system of claim 9, wherein $T_{control}$ is a smooth monotonically increasing function of the wafer temperature.

17. The thermal processing system of claim 9, wherein the first constant and the second constant sum approximately to unity when the heated surface and the second surface present a solid angle of substantially $4\pi$ to the wafer.

18. A method of thermally processing a wafer at a desired temperature, the method comprising the steps of:

supplying heat to at least one heated surface within a thermal processing system having at least one additional surface;

measuring the temperature of the at least one heated surface and the temperature of the at least one additional surface;

calculating a control parameter $T_{control}$ that is a linear combination equal to a first constant times the temperature of the at least one heated surface plus a second constant times the temperature of the at least one additional surface; and adjusting the power applied to the at least one heated surface in response to the control parameter.

19. The method of claim 18, wherein the first constant is the ratio of a change in the wafer temperature to a change in the temperature of the at least one heated surface with the temperatures of the other surfaces held substantially constant, and wherein the second constant is the ratio of a change in the wafer temperature to a change in the temperature of each of the at least one heated surface with the temperatures of the other surfaces held substantially constant.

20. The method of claim 18, wherein the control parameter is maintained at a substantially constant value while processing successive wafers.

21. The method of claim 18, wherein the control parameter is maintained within a range of values while processing successive wafers.

22. The method of claim 18, wherein the control parameter is maintained within a range of values while processing a wafer through a sequence of process steps.

* * * * *